United States Patent

Buccafusca et al.

(10) Patent No.: US 9,087,787 B1
(45) Date of Patent: Jul. 21, 2015

(54) PROCESS CONTROL MONITOR AND TECHNIQUE FOR THICK PHOTO-RESIST PHOTOLITHOGRAPHIC PROCESSES

(71) Applicant: Avago Technologies General IP (Singapore) Pte. Ltd., Singapore (SG)

(72) Inventors: Osvaldo Buccafusca, Fort Collins, CO (US); Jim Roland, Fort Collins, CO (US); David Hartzell Leebrick, Fort Collins, CO (US)

(73) Assignee: Avago Technologies General IP (Singapore) Pte. Ltd., Singapore (SG)

( * ) Notice: Subject to any disclaimer, the term of this patent is extended or adjusted under 35 U.S.C. 154(b) by 0 days.

(21) Appl. No.: 14/192,908

(22) Filed: Feb. 28, 2014

(51) Int. Cl.
*H01L 21/66* (2006.01)
*H01L 21/027* (2006.01)
*G03F 9/00* (2006.01)

(52) U.S. Cl.
CPC .............. *H01L 22/30* (2013.01); *G03F 9/7076* (2013.01); *G03F 9/7084* (2013.01); *H01L 21/027* (2013.01); *H01L 22/12* (2013.01)

(58) Field of Classification Search
CPC ....... H01L 22/30; H01L 21/027; H01L 22/12; G03F 9/7076; G03F 9/7084; G03F 9/7088; G03F 7/0005; G01N 21/9501
See application file for complete search history.

(56) References Cited

U.S. PATENT DOCUMENTS

| | | | |
|---|---|---|---|
| 6,562,545 B1 | 5/2003 | Hembree et al. | |
| 2010/0164075 A1 | 7/2010 | Botula et al. | |
| 2013/0065328 A1* | 3/2013 | Wang et al. | 438/8 |

OTHER PUBLICATIONS

Gert Homm et al., "Photolithography and Self-Aligned Subtractive and Additive Patterning of Conductive Materials", Materials Science and Technology, www.intechopen.com, Mar. 2012, pp. 41-58.
"Photolithography" Department of Mechanical Engineering, University of Pittsburgh, pp. 1-31.

* cited by examiner

*Primary Examiner* — Yasser A Abdelaziez
*Assistant Examiner* — Farun Lu

(57) ABSTRACT

A process control monitor for determination of alignment between layers of a semiconductor structure includes a patterned layer having a plurality of lines formed on a base layer, the plurality of lines enclosed within a circle. A photo-resist layer is deposited on top of the base layer and over the patterned layer. The photo-resist layer may be patterned to include an opening that exposes a portion of the base layer adjacent the patterned layer and that exposes a portion of the patterned layer. Alignment between the patterned layer and the patterned photo-resist layer may be determined according to a contrast between the exposed portion of the base layer and the exposed portion of the patterned layer.

24 Claims, 4 Drawing Sheets

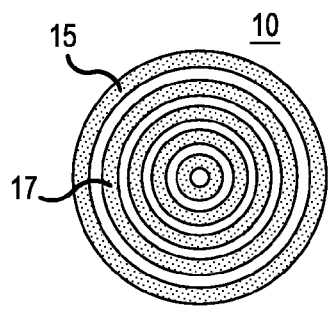 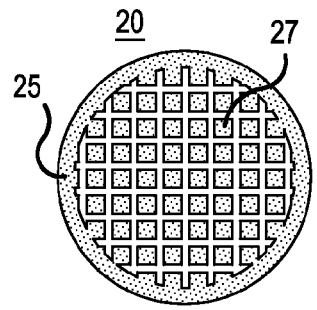 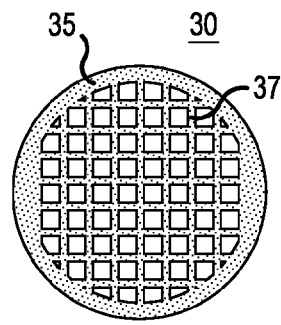
FIG.1　　　FIG.2　　　FIG.3
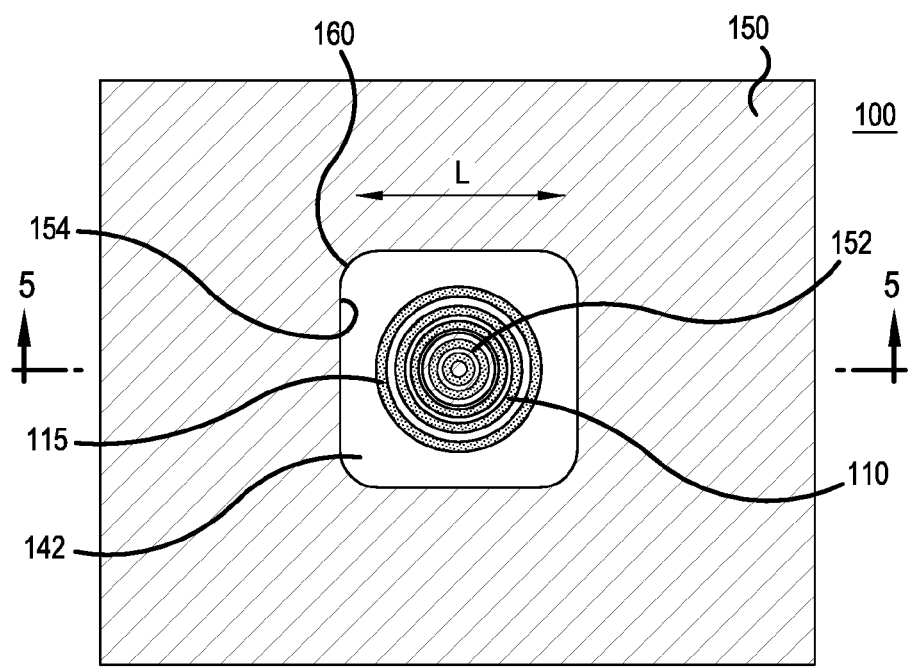
FIG.4

PROCESS CONTROL MONITOR AND TECHNIQUE FOR THICK PHOTO-RESIST PHOTOLITHOGRAPHIC PROCESSES

BACKGROUND

In standard semiconductor processes, etching and ion implantation typically include the use of photo-resist layers having a thickness of about 2 μm or less. In contrast, photo-resist layers having substantially greater thicknesses within a range of about 25 μm to 300 μm are needed for processing of microelectromechanical systems (MEMS), copper pillars and bumps for example. Such thick photo-resist layer processing presents challenges not only with respect to manufacturing, but also with respect to metrology necessary for process control of critical dimensions (CD) and mask alignment (also known as overlay measurements). The critical dimensions may be small features such as a small line or a set of lines that are intended to be generated in the photo-resist layer. After development of the photo-resist layer, the small features are measured to evaluate the fidelity of the processes. Mask alignment involves evaluating features generated in a previous step or layer, and features generated in a subsequent photo-resist layer for example, to validate alignment of the corresponding masks used to form the respective layers.

In order to control the photolithographic processes, specially designed features called process control monitors (PCMs) are used. The PCMs are embedded in the semiconductor processes used to build a structure. The metrology to control photo-resist processing steps is typically based on optical techniques such as imaging, which relies on contrast to distinguish features. However, when thick photo-resist layers are used during processing, the semi-transparent nature of the photo-resist makes it difficult to distinguish contrast between features in different layers. In addition, the substantially thick photo-resist layers make image focusing problematic, especially at high magnifications.

What is needed therefore is a process control monitor and technique for thick photo-resist photolithographic processes that improves contrast between imaged features.

SUMMARY

In a representative embodiment, a method of determining alignment between layers of a semiconductor structure includes forming a patterned layer having a plurality of lines on a first layer, wherein the plurality of lines are enclosed within a circle; depositing a photo-resist layer on the first layer and over the patterned layer; patterning the photo-resist layer to include an opening that exposes a portion of the first layer adjacent the patterned layer and that exposes a portion of the patterned layer; and determining alignment between the patterned layer and the patterned photo-resist layer according to a contrast between the exposed portion of the first layer and the exposed portion of the patterned layer.

In another representative embodiment, a process control monitor for a semiconductor device includes a patterned layer having a plurality of lines on a first layer, wherein the plurality of lines are enclosed within a circle; and a patterned photo-resist layer on the first layer and over the patterned layer, the patterned photo-resist layer including an opening exposing a portion of the first layer adjacent the patterned layer and exposing a portion of the patterned layer.

BRIEF DESCRIPTION OF THE DRAWINGS

The example embodiments are best understood from the following detailed description when read with the accompanying drawing figures. It is emphasized that the various features are not necessarily drawn to scale. In fact, the dimensions may be arbitrarily increased or decreased for clarity of discussion. Wherever applicable and practical, like reference numerals refer to like elements.

FIG. 1 is a top plan view of a patterned layer of a process control monitor, the patterned layer having a plurality of concentric circles enclosed within a circle, according to a representative embodiment.

FIG. 2 is a top plan view of a patterned layer of a process control monitor, the patterned layer having a plurality of block-like portions enclosed within a circle, according to a representative embodiment.

FIG. 3 is a top plan view of a patterned layer of a process control monitor, the patterned layer having a plurality of intersecting lines enclosed within a circle, according to a representative embodiment.

FIG. 4 is a top plan view of a process control monitor, according to a representative embodiment.

DETAILED DESCRIPTION

Figure 5:
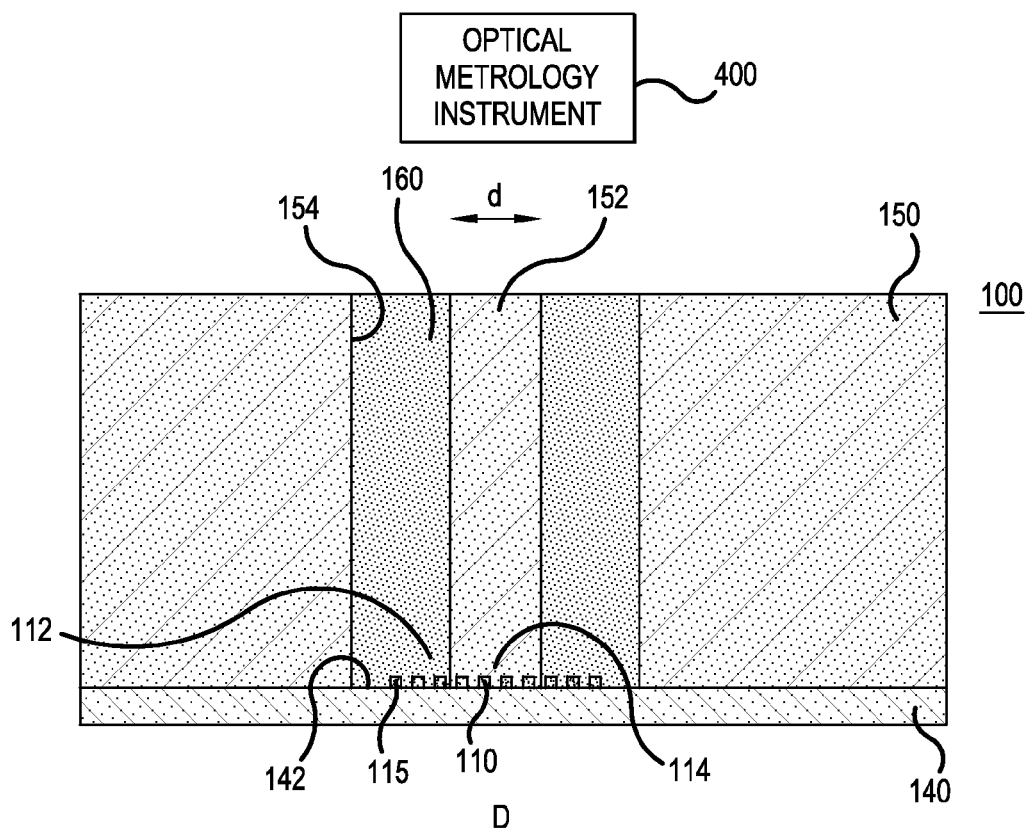
FIG. 5 is a cross-sectional view taken along line 5-5 of the process control monitor shown in FIG. 4, and including an optical metrology instrument in block diagram form, according to a representative embodiment.

In the following detailed description, for purposes of explanation and not limitation, representative embodiments disclosing specific details are set forth in order to provide a thorough understanding of the present teachings. However, it will be apparent to one having ordinary skill in the art having had the benefit of the present disclosure that other embodiments according to the present teachings that depart from the specific details disclosed herein remain within the scope of the appended claims. Moreover, descriptions of well-known apparatuses and methods may be omitted so as to not obscure the description of the representative embodiments. Such methods and apparatuses are clearly within the scope of the present teachings.

Generally, it is understood that the drawings and the various elements depicted therein are not drawn to scale. Further, relative terms, such as "above," "below," "top," "bottom," "upper," "lower," "left," "right," "vertical" and "horizontal," are used to describe the various elements' relationships to one another, as illustrated in the accompanying drawings. It is understood that these relative terms are intended to encompass different orientations of the device and/or elements in addition to the orientation depicted in the drawings. For example, if the device were inverted with respect to the view in the drawings, an element described as "above" another element, for example, would now be "below" that element. Likewise, if the device were rotated 90 degrees with respect to the view in the drawings, an element described as "vertical," for example, would now be "horizontal."

Further, as used in the specification and appended claims, the terms "a", "an" and "the" include both singular and plural referents, unless the context clearly dictates otherwise. Thus, for example, "a device" includes one device and plural devices.

As used in the specification and appended claims, and in addition to their ordinary meanings, the terms "substantial" or "substantially" mean to within acceptable limits or degree. For example, "substantially cancelled" means that one skilled in the art would consider the cancellation to be acceptable.

As used in the specification and the appended claims and in addition to its ordinary meaning, the term "approximately" means to within an acceptable limit or amount to one having ordinary skill in the art. For example, "approximately the same" means that one of ordinary skill in the art would consider the items being compared to be the same.

FIG. 1 is a top plan view of a patterned layer 10 of a process control monitor, patterned layer 10 having a plurality of lines such as concentric circles 17 enclosed within circle 15, according to a representative embodiment. As will be subsequently described, patterned layer 10 may be formed in a process step on a substrate or layer preliminary to a photo-resist forming step. Patterned layer 10 may be an upper base metal such as gold, aluminum, molybdenum or other metal alloy, whereby each of circle 15 and concentric circles 17 are metal. In other representative embodiments, patterned layer 10 may be a non-metal material such as a silicate glass or a semiconductor material. Patterned layer 10 as formed on the substrate or layer is designed as including circle 15 and concentric circles 17 so as to enhance contrast between patterned layer 10 and the surrounding and/or adjacent areas of the substrate or layer where patterned layer 10 does not exist. The contrast distinction occurs due to light and shadows created by patterned layer 10 becoming blurred by the focusing condition of an optical metrology instrument during imaging, as will be subsequently described. In a representative embodiment, the line width of circle 15 and concentric circles 17, and also the spacing between circle 15 and concentric circles 17, may be within a range of about 1 μm to 5 μm, and the external diameter of patterned layer 10 may be within a range of about 50 μm to 100 μm, to provide adequate contrast depending on the focal length of the optical metrology instrument used during imaging. Circle 15 as a circular enclosure is useful because circular fit algorithms may be used by the corresponding optical metrology instrument to improve accuracy of alignment determination based on concentric circle algorithms. The concentric circles 17 inside patterned layer 10 become blurred and are not distinguishable by the optical metrology instrument. However, circle 15 as a circular enclosure helps to improve accuracy. That is, to determine the misalignment, the optical metrology instrument employs a circular fit to the edge of circle 15. The circular fit improves accuracy through a statistical calculation by using a large number of points in circle 15. From the circle fit, the center of the circle 15 is determined. By having 2 circles such as circle 15 and another circle in the photo-resist portion of the process control monitor, the distances between the centers are compared and hence the misalignment in x and y directions can be determined.

FIG. 2 is a top plan view of a patterned layer 20 of a process control monitor, patterned layer 20 having a plurality of lines such as darker square-shaped portions 27 enclosed within circle 25, according to a representative embodiment. Similarly as described with respect to FIG. 1, patterned layer 20 may be formed in a process step on a substrate or layer preliminary to a photo-resist forming step. Patterned layer 20 may be an upper base metal such as gold, aluminum, molybdenum or other metal alloy, whereby each of circle 25 and square-shaped portions 27 are metal. In other representative embodiments, patterned layer 20 may be a non-metal material such as a silicate glass or a semiconductor material. Patterned layer 20 as formed on the substrate or layer is designed as including circle 25 and square-shaped portions 27 so as to enhance contrast between patterned layer 20 and the surrounding and/or adjacent areas of the substrate or layer where patterned layer 20 does not exist. In a representative embodiment, the line width of circle 25 and the dimensions of square-shaped portions 27 in either lateral direction, and also the spacing between square-shaped portions 27, may be within a range of about 1 μm to 5 μm, and the external diameter of patterned layer 20 may be within a range of about 50 μm to 100 μm, to provide adequate contrast depending on the focal length of the optical metrology instrument used during imaging.

FIG. 3 is a top plan view of a patterned layer 30 of a process control monitor, patterned layer 30 having a plurality of lines such as intersecting lines 37 perpendicular to each other enclosed within circle 35, according to a representative embodiment. Similarly as described with respect to FIGS. 1 and 2, patterned layer 30 may be formed in a process step on a substrate or layer preliminary to a photo-resist forming step. Patterned layer 30 may be an upper base metal such as gold, aluminum, molybdenum or other metal alloy, whereby each of circle 35 and intersecting lines 37 are metal. In other representative embodiments, patterned layer 30 may be a non-metal material such as a silicate glass or a semiconductor material. Patterned layer 30 as formed on the substrate or layer is designed as including circle 35 and intersecting lines 37 so as to enhance contrast between patterned layer 30 and the surrounding and/or adjacent areas of the substrate or layer where patterned layer 30 does not exist. In a representative embodiment, the line width of circle 35 and the line width of intersecting lines 37, and also the spacing between intersecting lines 37, may be within a range of about 1 μm to 5 μm, and the external diameter of patterned layer 30 may be within a range of about 50 μm to 100 μm, to provide adequate contrast depending on the focal length of the optical metrology instrument used during imaging.

FIG. 4 is a top plan view of process control monitor 100, according to a representative embodiment. FIG. 5 is a cross-sectional view taken along line 5-5 of process control monitor 100 shown in FIG. 4, and including an optical metrology instrument 400 in block diagram form, according to a representative embodiment.

Process control monitor 100, and a method of making process control monitor 100, will now be described with reference to FIGS. 4 and 5. A representative embodiment is described with reference to FIGS. 4 and 5 whereby process control monitor 100 includes patterned layer 110 having a plurality of lines such as concentric circles 17 enclosed within circle 15 of patterned layer 10 shown in FIG. 1. It should however be understood that in other representative embodiments, process control monitor 100 may instead include a patterned layer having a plurality of lines such as square-shaped portions 27 enclosed within circle 25 of patterned layer 20 shown in FIG. 2, or may instead include a patterned layer having a plurality of lines such as intersecting lines 37 enclosed within circle 35 of patterned layer 30 shown in FIG. 3.

As shown in FIG. 5, patterned layer 110 is formed on first layer 140. In a representative embodiment, first layer 140 may be a semiconductor layer such as silicon or gallium arsenide (GaAs). In other representative embodiments first layer 140 may be metal such as gold or aluminum, or a non-metal such as silicon oxide or silicon nitride, for example. Patterned layer 110 may be formed on first layer 140 using standard semiconductor processing techniques such as evaporation, patterning and etching, for example, as would be well understood by one of ordinary skill. In FIGS. 4 and 5, patterned layer 110 is shown as enclosed within circle 115. Similarly as described previously, the line width of circle 115 and the concentric circles within patterned layer 110, and also the spacing between circle 115 and the concentric circles within patterned layer 110, may be within a range of about 1 µm to 5 µm. Circle 115 and the concentric circles within patterned layer 110 may have a thickness within a range of about 0.1 to 2 µm. The external diameter D of patterned layer 110 as specifically shown in FIG. 5 may be within a range of about 50 µm to 100 µm, to provide adequate contrast depending on the focal length of the optical metrology instrument used during imaging. Patterned layer 110 may be formed on any convenient area of first layer 140.

Subsequent formation of patterned layer 110 on first layer 140 such as shown in FIG. 5, thick photo-resist layer 150 is applied on first layer 140 and over patterned layer 110. In this representative embodiment, photo-resist layer 150 has a thickness within a range of about 25 µm to 300 µm typical for processing of microelectromechanical systems (MEMS), copper pillars and bumps for example. In other representative embodiments, photo-resist layer 150 may have a thickness of at least 50 µm. Photo-resist layer 150 may include a dry film photo-resist.

Thereafter, photo-resist layer 150 is patterned to include opening 160 that exposes a portion 142 of first layer 140 adjacent patterned layer 110 as shown in FIGS. 4 and 5, and that also exposes a portion 112 of patterned layer 110 shown particularly in FIG. 5. Photo-resist layer 150 may be patterned by standard semiconductor photolithographic processes, as would be readily understood within the art. Exposed portion 142 of first layer 140 within opening 160 surrounds a periphery of patterned layer 110, or more particularly a periphery of exposed portion 112 of patterned layer 110. That is, exposed portion 142 of first layer 140 within opening 160 surrounds circle 115 of patterned layer 110. As may be further appreciated in view of FIG. 4 in particular, photo-resist layer 150 as patterned (which may be interchangeably characterized as patterned photo-resist layer 150 hereinafter) also includes columnar portion 152 disposed centrally within opening 160 and covering a central portion 114 (see FIG. 5) of patterned layer 110. The base of columnar portion 152 may have a diameter d as shown within a range of about 20 µm to 50 µm. Opening 160 may be square-shaped and may have lateral dimension L as shown within a range of about 100 µm to 200 µm. During processing, the corners of opening 160 may be rounded, which would not affect alignment detection as long as the radius of the rounded corner does not exceed L/10. As processed, patterned photo-resist layer 150 has substantially vertical, smooth walls.

In structures formed by way of standard semiconductor processes including masking and etching, photo-resist layers typically are formed as having a thickness of about 2 µm or less. Optical metrology instruments typically have a depth of focus sufficient to clearly image both the upper surface of a 2 µm photo-resist layer and the surface of the layer on which the photo-resist layer is formed, to easily detect and measure alignment or overlay between the corresponding layers. However, when processing structures using thick photo-resist layers in a range of about 25 µm to 300 µm, the depth of focus of optical metrology instruments is insufficient to clearly image both the upper surface of the thick photo-resist layer and a surface of the layer (base layer) on which the thick photo-resist layer is formed. This is usually a serious issue because the edges of features in the base layer may appear blurred and lose contrast, making standard alignment procedures difficult at best. In representative embodiments such as described with respect to FIGS. 4 and 5, process control monitor 100 is however formed as including patterned layer 110 which as configured uses the associated image blurring of the non-ideal focusing condition to increase contrast between patterned layer 110 and areas of first layer 140 surrounding patterned layer 110 when the optical metrology instrument images process control monitor 100 using a focal plane that is out of the base layer. This procedure consequently enables more accurate alignment determination in cases of structures with photo-resist layers having thickness within a range of about 25 µm to 300 µm.

As shown in FIG. 4, optical metrology instrument 400 in block diagram form is disposed over an upper surface of process control monitor 100, and is configured to image process control monitor 100 to measure and determine alignment between patterned layer 110 and patterned photo-resist layer 150. In more detail, patterned layer 110 may be formed during processing of a structure such as a MEMS, a copper pillar, or a solder bump which includes formation and patterning of a thick photo-resist layer such as photo-resist layer 150 having a thickness in a range of about 25 µm to 300 µm. Process control monitor 100 may be formed in a peripheral region or area of a wafer or integrated circuit (IC). Optical metrology instrument 400 may be configured to include a camera, a controller and/or processor, a display and a user input/output (I/O) port, and may image process control monitor 100 and determine alignment between patterned layer 110 and photo-resist layer 150 based on the relative alignment between the outer dimensions of patterned layer 110 and the outer dimensions of columnar portion 152. The increased contrast between patterned layer 110 and exposed portion 142 of first layer 140 within opening 160 as created due to the configuration of patterned layer 110 including a plurality of lines such as concentric circles enclosed within circle 115, enables optical metrology instrument 400 to accurately determine the distance between circle 115 of patterned layer 110 and columnar portion 152 within opening 160 at various points around the periphery of columnar portion 152. Of note, opening 160 is square to make sure that the circular fit algorithm as previously described with respect to FIG. 1 may be applied and will not use opening 160 as a circle for alignment determination. Accordingly, in a representative embodiment, improved contrast is provided as described above, so that optical metrology instrument 400 may thus accurately determine alignment between patterned layer 110 and photo-resist layer 150 having a thickness in a range of about 25 µm to 300 µm.

Figure 6:
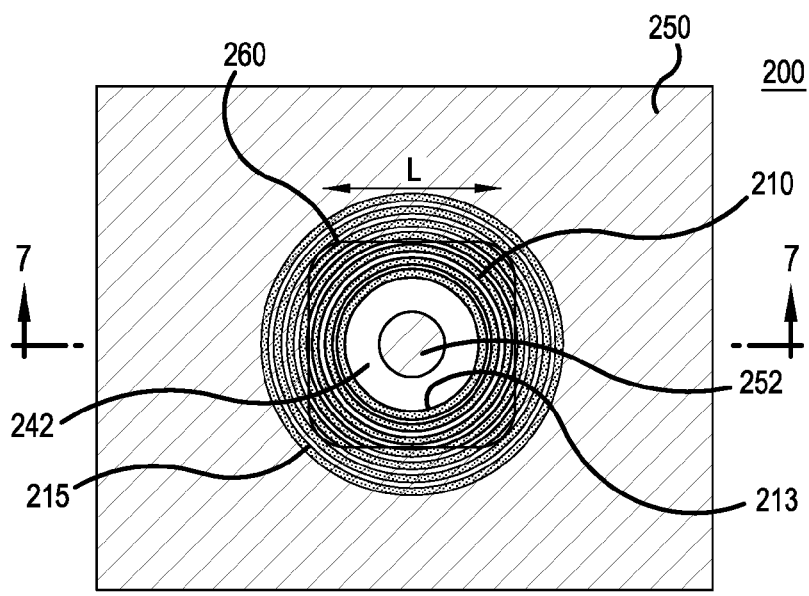
FIG. 6 is a top plan view of another process control monitor, according to a representative embodiment.
Figure 7:
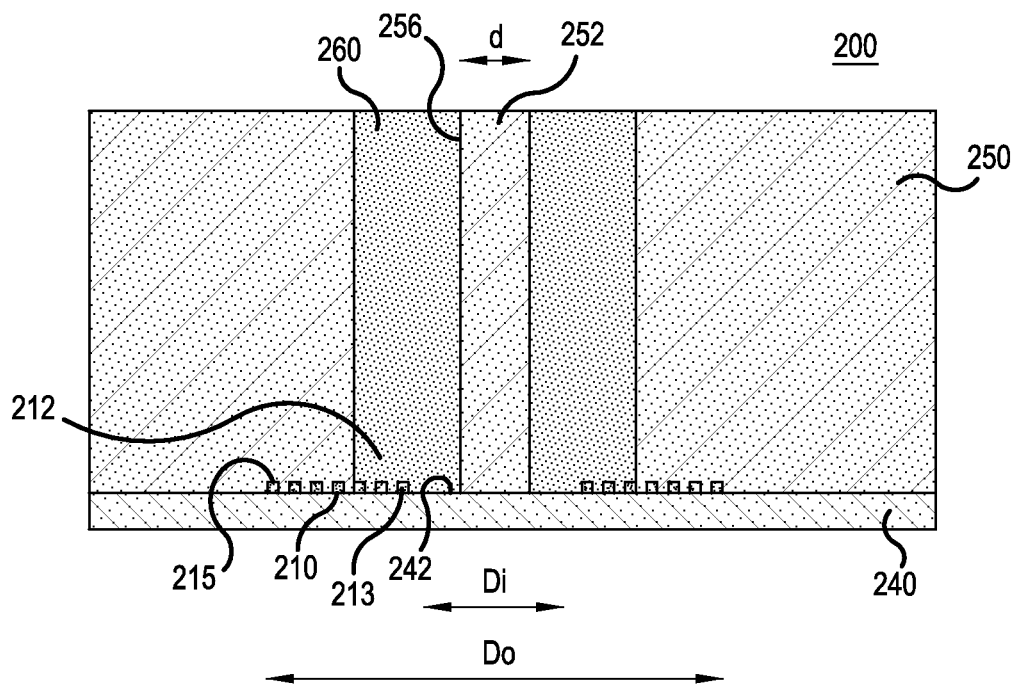
FIG. 7 is a cross-sectional view taken along line 7-7 of the process control monitor shown in FIG. 6, according to a representative embodiment.

FIG. 6 is a top plan view of process control monitor 200, according to a representative embodiment. FIG. 7 is a cross-sectional view taken along line 7-7 of process control monitor 200 shown in FIG. 6, according to a representative embodiment. Although omitted from FIG. 7 for the sake of simplicity, in this representative embodiment an optical metrology instrument such as optical metrology instrument 400 shown in FIG. 5 may be disposed over an upper surface of process control monitor 200.

Process control monitor 200, and a method of making process control monitor 200, will now be described with reference to FIGS. 6 and 7. Like reference numerals are provided to indicate similar features as shown in FIGS. 4 and 5, and detailed description of similar components and/or processes as described with respect to FIGS. 4 and 5 may be omitted from the following for the sake of brevity. A representative embodiment is described with reference to FIGS. 6 and 7 whereby process control monitor 200 includes patterned layer 210 having a plurality of lines such as concentric circles 17 enclosed within circle 15 of patterned layer 10 shown in FIG. 1. It should however be understood that in other representative embodiments, process control monitor 200 may instead include a patterned layer having a plurality of lines such as square-shaped portions 27 enclosed within circle 25 of patterned layer 20 shown in FIG. 2, or may instead include a patterned layer having a plurality of lines such as intersecting lines 37 enclosed within circle 35 of patterned layer 30 shown in FIG. 3.

As shown in FIG. 7, patterned layer 210 is formed on first layer 240. First layer 240 may be a semiconductor layer such as silicon or gallium arsenide (GaAs). In other representative embodiments first layer 240 may be metal such as gold, or a non-metal such as silicon oxide or silicon nitride, for example. In FIGS. 6 and 7, patterned layer 210 is shown as enclosed within circle 215 and as having an innermost concentric circle 213. Similarly as described previously, the line width of circle 215 and the concentric circles within patterned layer 210, and also the spacing between circle 215 and the concentric circles within patterned layer 210, may be within a range of about 1 µm to 5 µm. The external diameter Do of patterned layer 210 as specifically shown in FIG. 7 may be within a range of about 100 µm to 200 µm and should be at least about 50% larger than dimension L, to provide adequate contrast depending on the focal length of the optical metrology instrument used during imaging. The internal diameter Di of patterned layer 210 may be within a range of about 50 µm to 100 µm, which must be larger than diameter d.

Subsequent formation of patterned layer 210 on first layer 240 such as shown in FIG. 7, photo-resist layer 250 is applied on first layer 240 and over patterned layer 210. In this representative embodiment, photo-resist layer 250 has a thickness within a range of about 25 µm to 300 µm typical for processing of microelectromechanical systems (MEMS), copper pillars and bumps for example. In other representative embodiments, photo-resist layer 250 may have a thickness of at least 50 µm. Photo-resist layer 250 may include a dry film photo-resist.

Thereafter, photo-resist layer 250 is patterned to include opening 260 that exposes a portion 242 of first layer 240 adjacent patterned layer 210 as shown in FIGS. 6 and 7, and that also exposes a portion 212 of patterned layer 210 shown particularly in FIG. 7. Patterned layer 210 surrounds a periphery of exposed portion 242 of first layer 240 within opening 260. More particularly, innermost concentric circle 213 of exposed portion 212 of patterned layer 210 surrounds a periphery of exposed portion 242 of first layer 240. As may be further appreciated in view of FIG. 6 in particular, photo-resist layer 250 as patterned (which may be interchangeably characterized as patterned photo-resist layer 250 hereinafter) also includes columnar portion 252 disposed centrally within opening 260 on first layer 240. The base of columnar portion 252 may have a diameter d as shown within a range of about 20 µm to 50 µm, which must be smaller than Di. Opening 260 may be square-shaped and may have a dimension L as shown within a range of about 100 µm to 200 µm, and may have rounded corners having a radius that does not exceed L/10.

As described previously, an optical metrology instrument such as optical metrology instrument 400 shown and described with respect to FIG. 5 disposed over an upper surface of process control monitor 200 may be configured to image process control monitor 200 to measure and determine alignment between patterned layer 210 and patterned photo-resist layer 250 based on the relative alignment between the inner dimension of patterned layer 210 and the outer dimension of columnar portion 252. The increased contrast between innermost concentric circle 213 and exposed portion 242 of first layer 240 within opening 260 as created due to the configuration of patterned layer 210 including a plurality of lines such as concentric circles enclosed within innermost concentric circle 213, enables the optical metrology instrument to accurately determine the distance between innermost concentric circle 213 and columnar portion 252 at various points around the periphery of columnar portion 252. Accordingly, in a representative embodiment as described above, improved contrast is provided so that an optical metrology instrument may thus accurately determine alignment between patterned layer 210 and photo-resist layer 250 having a thickness in a range of about 25 µm to 300 µm.

Figure 8:
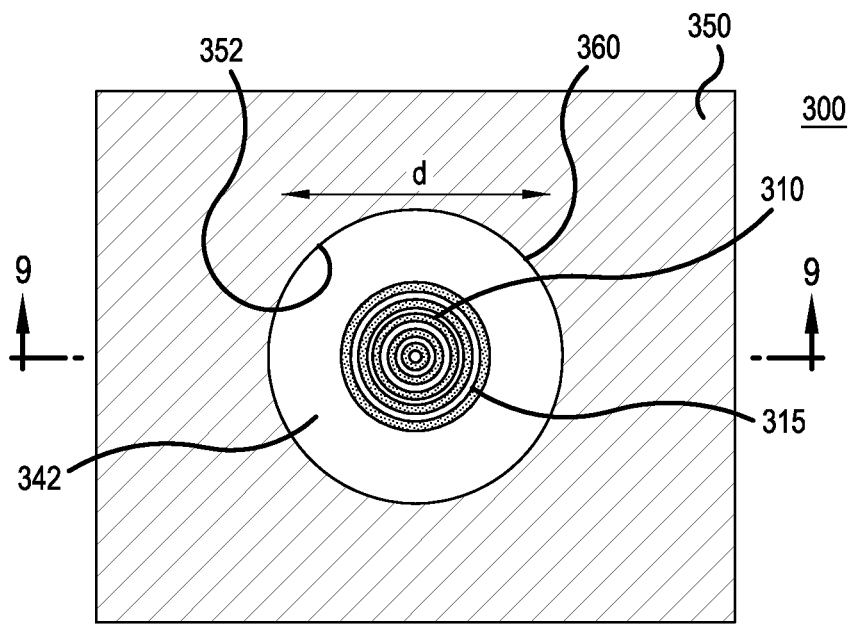
FIG. 8 is a top plan view of still another process control monitor, according to a representative embodiment.
Figure 9:
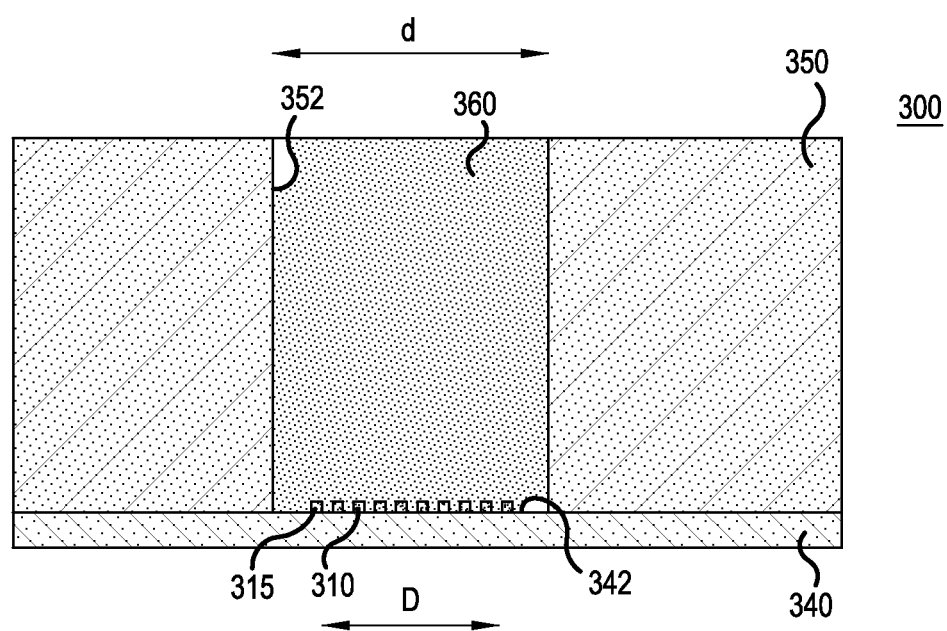
FIG. 9 is a cross-sectional view taken along line 9-9 of the process control monitor shown in FIG. 8, according to a representative embodiment.

FIG. 8 is a top plan view of process control monitor 300, according to a representative embodiment. FIG. 9 is a cross-sectional view taken along line 9-9 of process control monitor 300 shown in FIG. 8, according to a representative embodiment. Although omitted from FIG. 9 for the sake of simplicity, in this representative embodiment an optical metrology instrument such as optical metrology instrument 400 shown in FIG. 5 may be disposed over an upper surface of process control monitor 200.

Process control monitor 300, and a method of making process control monitor 300, will now be described with reference to FIGS. 8 and 9. Like reference numerals are provided to indicate similar features as shown in FIGS. 4 and 5, and detailed description of similar components and/or processes as described with respect to FIGS. 4 and 5 may be omitted from the following for the sake of brevity. A representative embodiment is described with reference to FIGS. 8 and 9 whereby process control monitor 300 includes patterned layer 310 having a plurality of lines such as concentric circles 17 enclosed within circle 15 of patterned layer 10 shown in FIG. 1. It should however be understood that in other representative embodiments, process control monitor 300 may instead include a patterned layer having a plurality of lines such as square-shaped portions 27 enclosed within circle 25 of patterned layer 20 shown in FIG. 2, or may instead include a patterned layer having a plurality of lines such as intersecting lines 37 enclosed within circle 35 of patterned layer 30 shown in FIG. 3.

As shown in FIG. 9, patterned layer 310 is formed on first layer 340. First layer 340 may be a semiconductor layer such as silicon or gallium arsenide (GaAs). In other representative embodiments first layer 340 may be metal such as gold, or a non-metal such as silicon oxide or silicon nitride, for example. In FIGS. 8 and 9, patterned layer 310 is shown as enclosed within circle 315. Similarly as described previously, the line width of circle 315 and the concentric circles within patterned layer 310, and also the spacing between circle 315 and the concentric circles within patterned layer 310, may be within a range of about 1 µm to 5 µm. The external diameter D of patterned layer 310 as specifically shown in FIG. 9 may be within a range of about 40 µm to 100 µm, to provide adequate contrast depending on the focal length of the optical metrology instrument used during imaging.

Subsequent formation of patterned layer 310 on first layer 340 such as shown in FIG. 9, photo-resist layer 350 is applied on first layer 340 and over patterned layer 310. In this representative embodiment, photo-resist layer 350 has a thickness within a range of about 25 µm to 300 µm typical for processing of microelectromechanical systems (MEMS), copper pillars and bumps for example. In other representative embodiments, photo-resist layer 350 may have a thickness of at least 50 µm. Photo-resist layer 350 may include a dry film photo-resist.

Thereafter, photo-resist layer 350 is patterned to include opening 360 that exposes a portion 342 of first layer 340 adjacent patterned layer 310 as shown in FIGS. 8 and 9, and that also exposes patterned layer 310. Exposed portion 342 of first layer 340 surrounds a periphery of patterned layer 310 within opening 360, or more particularly exposed portion 342 of first layer 340 surrounds circle 315 of patterned layer 310. As may be further appreciated in view of FIG. 8 in particular, photo-resist layer 350 as patterned (which may be interchangeably characterized as patterned photo-resist layer 350 hereinafter) does not include a columnar portion disposed within opening 360. Of note, in this representative embodiment, opening 360 must be cylindrical-shaped, and may have diameter d as shown within a range of about 60 µm to 100 µm, and must be larger than D.

As described previously, an optical metrology instrument such as optical metrology instrument 400 shown and described with respect to FIG. 5 disposed over an upper surface of process control monitor 300 may be configured to image process control monitor 300 to measure and determine alignment between patterned layer 310 and patterned photo-resist layer 350 based on the relative alignment between the outer dimension of patterned layer 310 and the dimension of wall 352 of opening 360. That is, the increased contrast between circle 315 of patterned layer 310 and exposed portion 342 of first layer 340 within opening 360 as created due to the configuration of patterned layer 310 including a plurality of lines such as concentric circles within circle 315, enables an optical metrology instrument to accurately determine the distance between circle 315 and wall 352 at various points around the periphery of patterned layer 310. Of note, patterned layer 310 is designed to be blurred as the focal plane of an optical metrology instrument is off that layer. Thus, from the point of the optical metrology instrument, process control monitor 300 is seen as a filled circle that is darker than the surroundings. The optical metrology instrument sees an inner dark circle (patterned layer 310) surrounded by a lighter circle (exposed portion 342 of first layer 340), surrounded by another darker area (photo-resist layer 350). Accordingly, in a representative embodiment as described above, improved contrast is provided so that an optical metrology instrument may thus accurately determine alignment between patterned layer 310 and photo-resist layer 350 having a thickness in a range of about 25 µm to 300 µm.

The various components, materials, structures and parameters are included by way of illustration and example only and not in any limiting sense. In view of this disclosure, those skilled in the art can implement the present teachings in determining their own applications and needed components, materials, structures and equipment to implement these applications, while remaining within the scope of the appended claims.

The invention claimed is:

1. A method of determining alignment between layers of a semiconductor structure, the method comprising:
    forming a patterned layer having a plurality of lines on a first layer, wherein the plurality of lines are enclosed within a circle;
    depositing a photo-resist layer on the first layer and over the patterned layer;
    patterning the photo-resist layer to include an opening that exposes a portion of the first layer adjacent the patterned layer and that exposes a portion of the patterned layer; and
    determining alignment between the patterned layer and the patterned photo-resist layer according to a contrast between the exposed portion of the first layer and the exposed portion of the patterned layer.

2. The method of claim 1, wherein the plurality of lines comprises concentric circles.

3. The method of claim 1, wherein the plurality of lines comprises intersecting lines perpendicular to each other.

4. The method of claim 1, wherein the patterned photo-resist layer comprises a columnar portion of the photo-resist layer disposed within the opening and covering a central portion of the patterned layer.

5. The method of claim 1, wherein the exposed portion of the first layer surrounds a periphery of the patterned layer.

6. The method of claim 1, wherein the patterned layer surrounds a periphery of the exposed portion of the first layer.

7. The method of claim 6, wherein the patterned photo-resist layer comprises a columnar portion of the photo-resist layer disposed within the opening and covering a central portion of the exposed portion of the first layer.

8. The method of claim 1, wherein the photo-resist layer has a thickness of at least 50 microns.

9. The method of claim 1, wherein the photo-resist comprises dry film photo-resist.

10. The method of claim 1, wherein the patterned layer comprises a metal.

11. The method of claim 1, wherein the opening is square-shaped.

12. The method of claim 1, wherein the opening is cylindrical-shaped.

13. The method of claim 1, wherein the first layer comprises a semiconductor layer.

14. A process control monitor for a semiconductor device comprising:
    a patterned layer having a plurality of lines on a first layer, wherein the plurality of lines are enclosed within a circle; and
    a patterned photo-resist layer on the first layer and over the patterned layer,
    the patterned photo-resist layer including an opening exposing a portion of the first layer adjacent the patterned layer and exposing a portion of the patterned layer.

15. The process control monitor of claim 14, wherein the plurality of lines comprises concentric circles.

16. The process control monitor of claim 14, wherein the plurality of lines comprises intersecting lines perpendicular to each other.

17. The process control monitor of claim 14, wherein the patterned photo-resist layer comprises a columnar portion within the opening and covering a central portion of the patterned layer.

18. The process control monitor of claim 14, wherein the exposed portion of the first layer surrounds a periphery of the patterned layer.

19. The process control monitor of claim 14, wherein the patterned layer surrounds a periphery of the exposed portion of the first layer.

20. The process control monitor of claim 14, wherein the patterned photo-resist layer comprises a columnar portion disposed within the opening and covering a central portion of the exposed portion of the first layer.

21. The process control monitor of claim 14, wherein the patterned layer comprises a metal.

22. The process control monitor of claim 14, wherein the opening is square-shaped.

23. The process control monitor of claim 14, wherein the opening is cylindrical-shaped.

24. The process control monitor of claim 14, wherein the first layer comprises a semiconductor layer.

* * * * *